(12) United States Patent
Kaneko

(10) Patent No.: US 11,227,866 B2
(45) Date of Patent: Jan. 18, 2022

(54) SEMICONDUCTOR DEVICE INCLUDING CAPACITOR AND METHOD OF FORMING THE SAME

(71) Applicant: MICRON TECHNOLOGY, INC., Boise, ID (US)

(72) Inventor: Akira Kaneko, Higashihiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/823,226

(22) Filed: Mar. 18, 2020

(65) Prior Publication Data

US 2021/0296430 A1    Sep. 23, 2021

(51) Int. Cl.
*H01L 27/108*  (2006.01)

(52) U.S. Cl.
CPC .. *H01L 27/10852* (2013.01); *H01L 27/10814* (2013.01); *H01L 27/10823* (2013.01)

(58) Field of Classification Search
CPC ....... H01L 27/108–10897; H01L 28/40; H01L 28/82; H01L 28/90–92
See application file for complete search history.

(56) References Cited

U.S. PATENT DOCUMENTS

2021/0036101 A1*   2/2021   Choi ................ H01L 27/10814

* cited by examiner

*Primary Examiner* — Robert G Bachner
*Assistant Examiner* — Molly K Reida
(74) *Attorney, Agent, or Firm* — Dorsey & Whitney LLP

(57) ABSTRACT

A semiconductor device includes a substrate, a lower electrode provided over the substrate, a capacitive insulating film, and an upper electrode provided over the lower electrode, wherein the lower electrode has an upper portion and a lower portion, and at a boundary between the upper portion and the lower portion, the diameter of the upper portion is smaller than the diameter of the lower portion.

16 Claims, 8 Drawing Sheets

SEMICONDUCTOR DEVICE INCLUDING CAPACITOR AND METHOD OF FORMING THE SAME

BACKGROUND

In a semiconductor device such as dynamic random access memory (hereinafter referred to as DRAM) for example, data is retained by accumulating charge in an internally provided capacitor. Recently, the size of an elements including a capacitor is being reduced in order to increase the data storage capacity of DRAM.

However, because the capacitor adopts a conductor-insulator-conductor stacked structure, reducing the size of the capacitor reduces the capacitance of the capacitor, and the data retention characteristics are worsened. The capacitance of a capacitor depends on the surface area of the capacitor structure. In recent years, to increase the surface area of the capacitor, a vertical capacitor structure has been proposed in which a conductor is formed inside a hole formed with a high aspect ratio in the vertical direction, and the conductor is used as the lower electrode.

However, with the vertical capacitor structure, because the hole has a high aspect ratio in the vertical direction, the bottom diameter of the hole decreases while the top diameter of the hole increases. If the lower electrode of the capacitor is formed by burying a conductor in the hole, the bottom diameter of the lower electrode decreases while the top diameter of the lower electrode increases. For this reason, at the top of the lower electrode, the interval with respect to a neighboring lower electrode becomes narrow, and in some cases, a capacitive insulating film and the upper electrode cannot be formed. Also, if one attempts to reduce the top diameter of the lower electrode, the bottom diameter becomes smaller, and an opening may not be formed in the floor of the lower electrode in some cases.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, an embodiment will be described with reference to FIGS. 1A to 8. In the following description, DRAM is given as an example of a semiconductor device 1.

Figure 8:
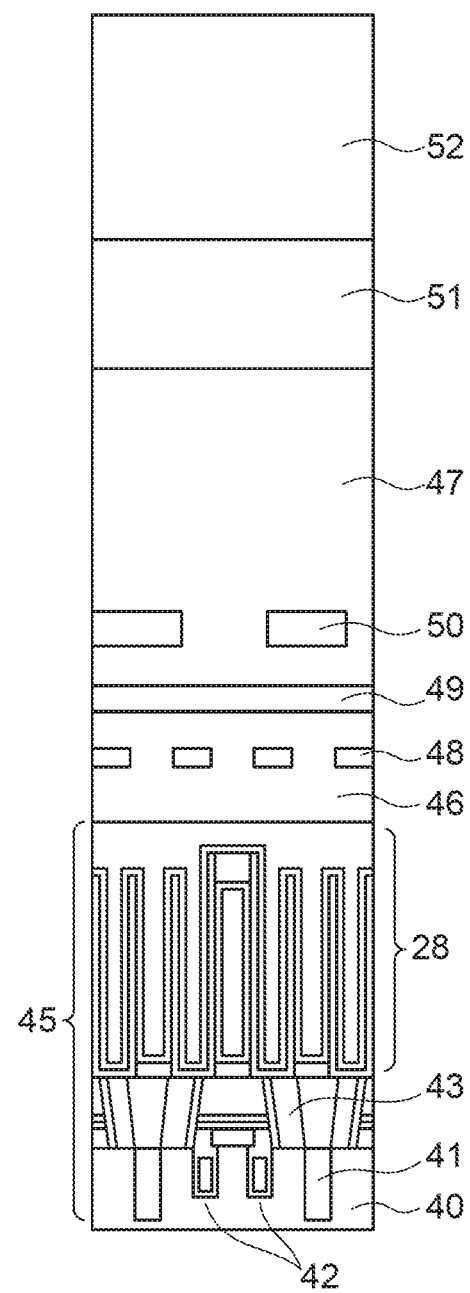
FIG. 8 is a longitudinal section illustrating one example of an overall diagrammatic configuration of a memory cell region in a semiconductor memory device according to an embodiment.

FIG. 8 is a longitudinal section illustrating one example of an overall diagrammatic configuration of a memory cell region in a semiconductor memory device according to the embodiment. A capacitor 28 illustrated in FIG. 8 corresponds to the regions illustrated in FIGS. 1B, 2B, 3B, 4B, 5B, and 6B. As illustrated in FIG. 8, below the capacitor 28, components such as a semiconductor substrate 40, a shallow trench isolation 41, an access transistor 42, and a capacitor contact 43 forming a memory cell 45 of DRAM are provided. In other words, the capacitor 28 is provided on the semiconductor substrate 40 in which components such as the shallow trench isolation 41, the access transistor 42, and the capacitor contact 43 are formed. A lower electrode of the capacitor 28 illustrated in FIG. 8 is electrically connected, through the capacitor contact 43, to one side of a source-drain region of the access transistor 42 formed in an active region of the semiconductor substrate 40. In other words, a lower electrode 20 of the capacitor 28 is connected to the semiconductor substrate 40.

Like the configuration illustrated in FIG. 8, components such as the semiconductor substrate 40, the shallow trench isolation 41, the access transistor 42, and the capacitor contact 43 are provided below the diagrams illustrated in FIGS. 1B, 2B, 3B, 4B, 5B, and 6B described later. The step illustrated in FIG. 1B described later is performed on the semiconductor substrate 40 provided with components such as the shallow trench isolation 41, the access transistor 42, and the capacitor contact 43.

Also, as illustrated in FIG. 8, multilevel upper wiring layers containing components such as interconnects 48, 49, 50, and 51 are provided above the capacitor 28. In other words, an upper electrode 26 of the capacitor 28 is disposed near the multilevel upper wiring layers containing components such as the interconnects 48, 49, 50, and 51. The reference signs 46, 47, and 52 illustrated in FIG. 8 denote insulating films. After the step illustrated in FIG. 6B described later, the multilevel upper wiring layers are formed above the upper electrode 26 of the capacitor 28, like the configuration illustrated in FIG. 8. In other words, the upper electrode 26 of the capacitor 28 illustrated in FIG. 6B described later is disposed near the multilevel upper wiring layers.

In the cross-section views illustrated in FIGS. 1B, 2B, 3B, 4B, 5B, and 6B, a portion of a memory cell is drawn and a plurality of capacitors are illustrated. In actuality, components such as the active region, the access transistor, a word line, and a bit line that form the DRAM memory cell illustrated in FIG. 8 are provided below these diagrams. Like the configuration illustrated in FIG. 8, the lower electrode 20 of the capacitor illustrated in FIGS. 2B, 3B, 4B, 5B, and 6B is electrically connected to one side of a source-drain region of the access transistor formed in the active region of the semiconductor substrate.

Hereinafter, a method of manufacturing the semiconductor device 1 according to the embodiment will be described. As illustrated in FIG. 1B, a first insulating film 10, a second insulating film 12, a third insulating film 14, a fourth insulating film 16, and a fifth insulating film 18 are formed on a semiconductor substrate provided with components such as an active region, an access transistor, a word line, and a bit line, which are not illustrated. The first insulating film 10, the second insulating film 12, the third insulating film 14, the fourth insulating film 16, and the fifth insulating film 18 are all insulating films. The first insulating film 10, the third insulating film 14, and the fifth insulating film 18 include silicon nitride films, for example. The second insulating film 12 and the fourth insulating film 16 include silicon oxide films, for example.

The first insulating film 10, the second insulating film 12, the third insulating film 14, the fourth insulating film 16, and the fifth insulating film 18 are formed by chemical vapor deposition (hereinafter referred to as CVD), for example. The third insulating film 14 is patterned in a pattern similar to the fifth insulating film 18 illustrated in FIG. 3A described later using known photolithography technology and dry etching technology.

Figure 1A:
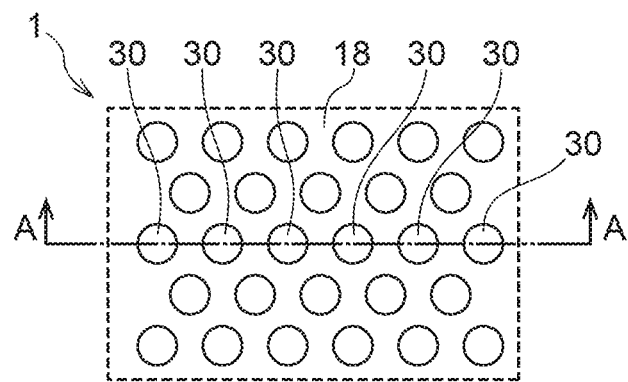
FIGS. 1A and 1B are a diagrammatic top view and a diagrammatic cross-sectional side view, respectively, of an example assembly at an example process stage of an example method for fabricating an example array of memory cells. The view of FIG. 1B is along the line A-A of FIG. 1A.
Figure 1B:
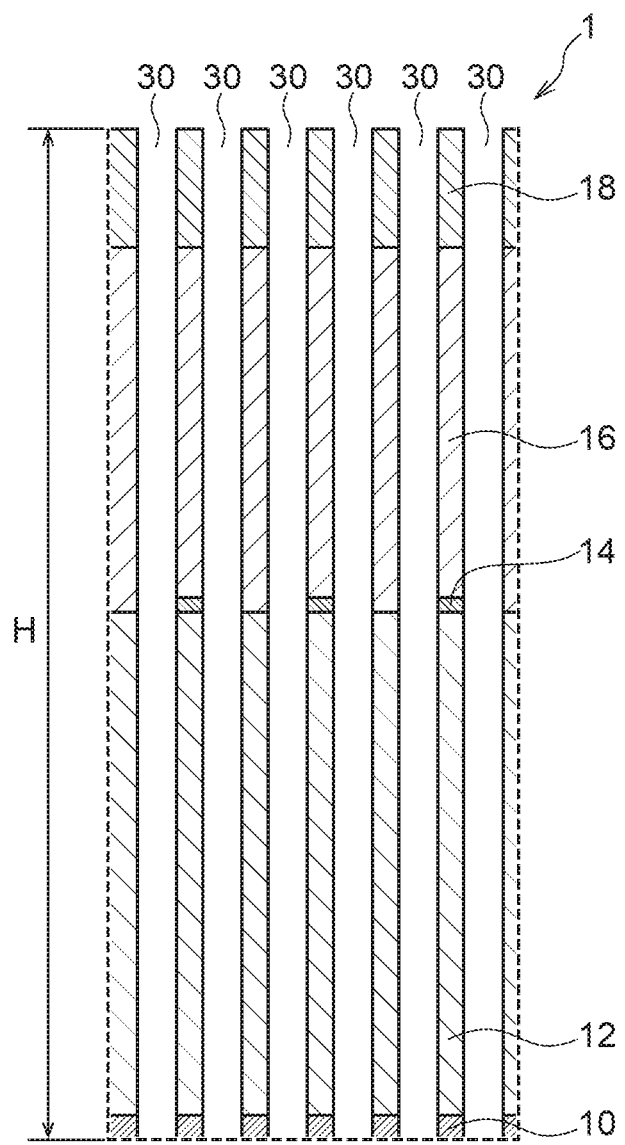

With respect to the structure in which the first insulating film 10, the second insulating film 12, the third insulating film 14, the fourth insulating film 16, and the fifth insulating film 18 are sequentially formed in this way, a plurality of holes 30 are formed using known photolithography technology and dry etching technology, as illustrated in FIGS. 1A and 1B. As illustrated in FIG. 1A, each of the holes 30 is round, and the holes 30 are arranged in a staggered layout.

As illustrated in FIG. 1B, the holes 30 are formed penetrating from a top face of the fifth insulating film 18 to a bottom face of the first insulating film 10. The vertical length H of the holes 30 is extremely long compared to the diameter of the holes 30. In other words, the aspect ratio of the holes 30 is extremely large. Herein, the aspect ratio of each hole 30 is computed by taking "vertical length H of hole 30/diameter of hole 30". For the diameter of the holes 30, the diameter at the top end of the holes 30 is used.

Figure 2A:
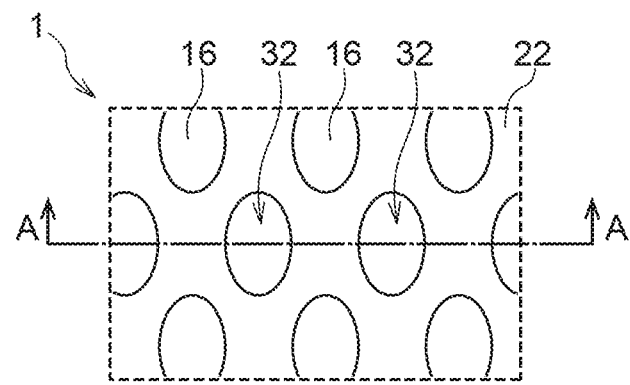
FIGS. 2A and 2B are a diagrammatic top view and a diagrammatic cross-sectional side view, respectively, of the example assembly of FIGS. 2A and 2B at an example process stage following that of FIGS. 1A and 1B. The view of FIG. 2B is along the line A-A of FIG. 2A.
Figure 2B:
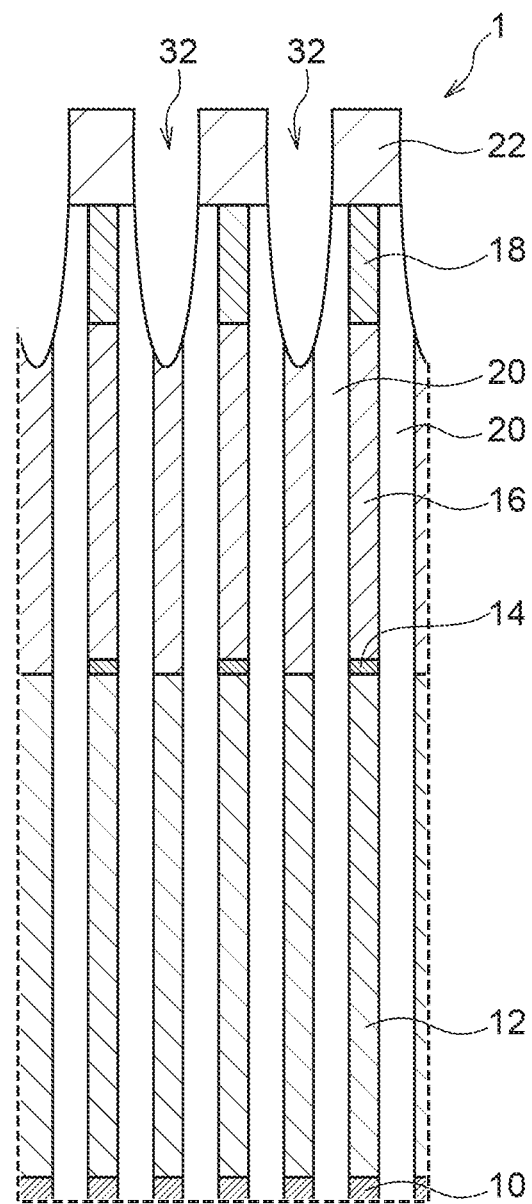

As illustrated in FIGS. 1B and 2B, because the holes 30 have a large aspect ratio, the opening diameter in an upper portion of the holes 30 is large, while the opening diameter in a lower portion is small.

Next, as illustrated in FIG. 2A, the plug-shaped or pillar-shaped lower electrodes 20 are formed inside the holes 30. The lower electrodes 20 are conductors, and contain a metal such as titanium nitride (TiN), for example. The lower electrodes 20 can be formed by filling the holes 30 with a metal by CVD, and then removing an excess portion in the upper portion by etch-back, for example. Because the shape of the lower electrodes 20 depends on the shape of the holes 30, the lower electrodes 20 have a large diameter in the upper portion and a small diameter in the lower portion. Note that the lower electrodes 20 mean the "lower electrode" of the capacitor described later, and do not mean that the electrodes are physically positioned lower.

Next, a sixth insulating film 22 is formed over the entire top face, and known photolithography technology and dry etching technology are used to form openings 32. As illustrated in FIG. 2A, each of the openings 32 is oval, for example, and the openings 32 are arranged in a staggered layout, for example. The openings 32 are formed by removing a part of the upper portions of the sixth insulating film 22, the fifth insulating film 18, and the fourth insulating film 16. The purpose of forming the openings 32 is to expose the fourth insulating film 16.

Figure 3A:
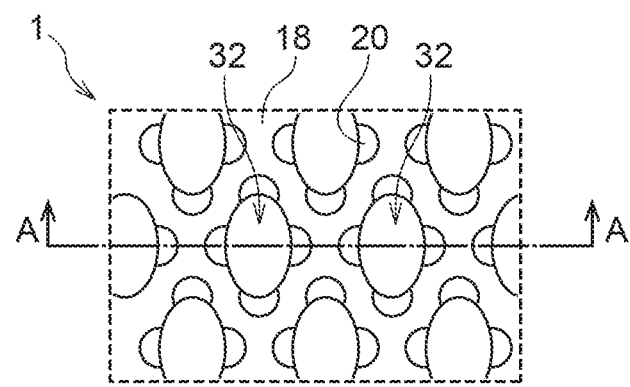
FIGS. 3A and 3B are a diagrammatic top view and a diagrammatic cross-sectional side view, respectively, of the example assembly of FIGS. 3A and 3B at an example process stage following that of FIGS. 2A and 2B. The view of FIG. 3B is along the line A-A of FIG. 3A.
Figure 3B:
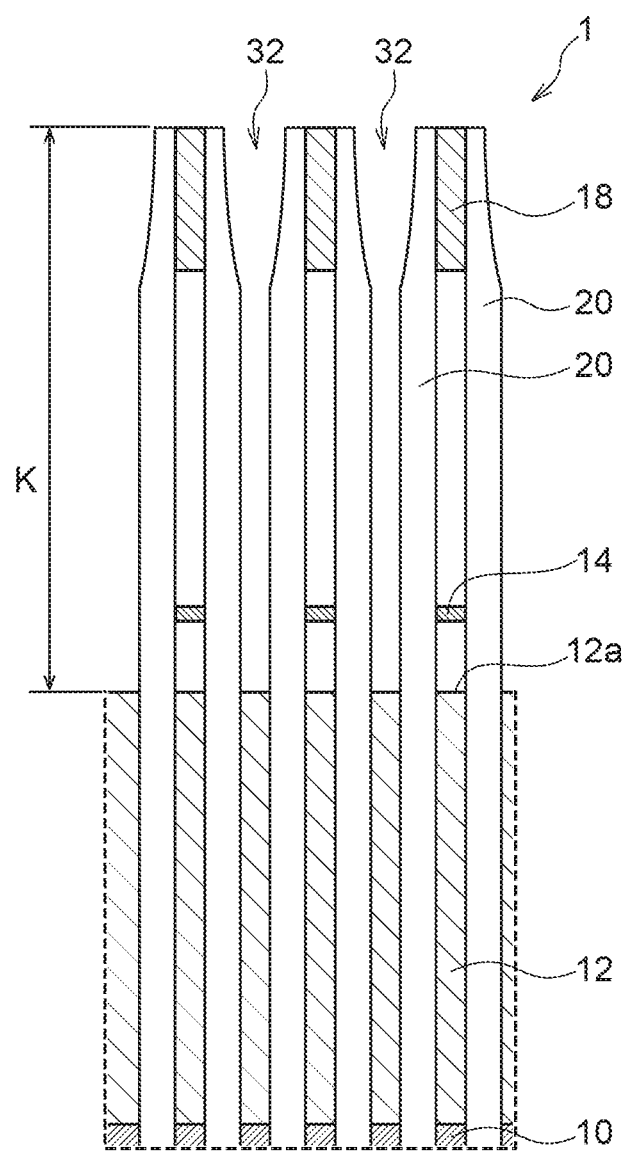

Next, as illustrated in FIGS. 3A and 3B, buffered hydrofluoric acid (hereinafter referred to as BHF) for example is used to etch away the fourth insulating film 16 and a part of the second insulating film 12. The etching is achieved by BHF passing through the openings 32 to reach the fourth insulating film 16 and the second insulating film 12. Silicon oxide films are etched by BHF. Silicon nitride films and titanium nitride are also etched by BHF, but the etch rate is extremely small, resulting in a sufficient selectivity ratio for silicon oxide films. For this reason, the etching amount by which the silicon nitride films and the titanium nitride films are etched is small enough to ignore. Consequently, the etching by BHF can remove the fourth insulating film 16 and a part of the second insulating film 12, leaving the fifth insulating film 18, the third insulating film 14, and the lower electrodes 20. The etching amount by which the fourth insulating film 16 and the second insulating film 12 are etched can be controlled according to the etching time. In other words, by controlling the etching time, the position of the top face 12a of the second insulating film 12 can be controlled.

As illustrated in FIG. 3A, in the fifth insulating film 18 patterned in a mesh, the upper edges of the lower electrodes 20 are in integrated contact with the upper edges of all of the lower electrodes 20. With this arrangement, the fifth insulating film 18 functions as a beam that joins the lower electrodes 20 to each other. Additionally, the third insulating film 14 patterned in a pattern similar to the fifth insulating film 18 similarly functions as a beam that joins the lower electrodes 20 to each other. The openings 32 are arranged in a layout such that each opening 32 is positioned between four adjacent lower electrodes 20.

As illustrated in FIG. 3B, by etching with BHF as described above, the surfaces of the lower electrodes 20 are exposed in the region above the top face 12a of the second insulating film 12, namely the region K in the diagram.

Figure 4A:
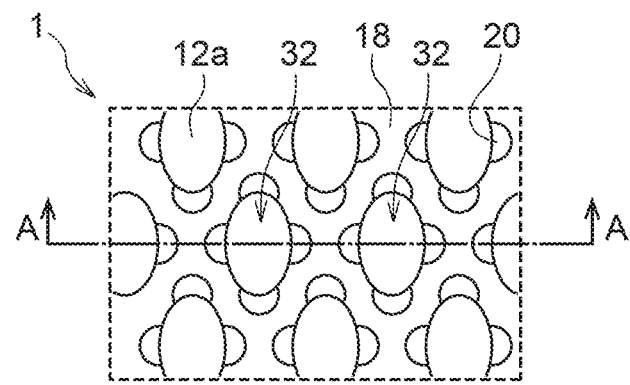
FIGS. 4A and 4B are a diagrammatic top view and a diagrammatic cross-sectional side view, respectively, of the example assembly of FIGS. 4A and 4B at an example process stage following that of FIGS. 3A and 3B. The view of FIG. 4B is along the line A-A of FIG. 4A.
Figure 4B:
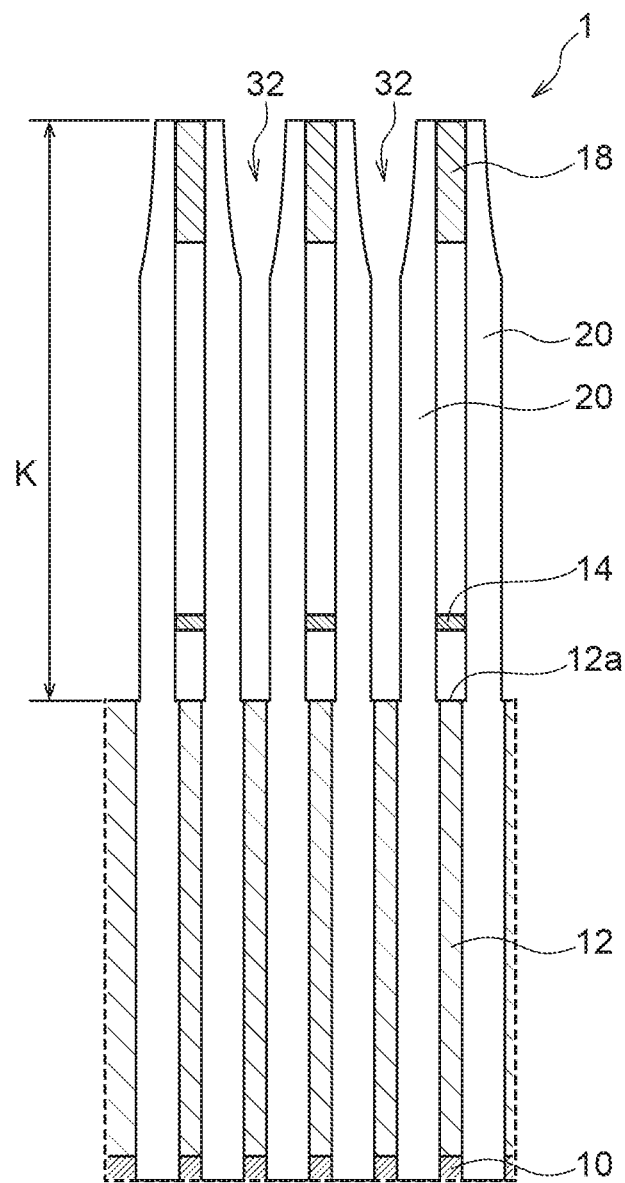

Next, as illustrated in FIGS. 4A and 4B, the lower electrodes 20 exposed in the region K are etched to decrease the diameter of the lower electrodes 20. The etching can be performed using a diluted hydrogen peroxide solution, for example. The titanium nitride forming the lower electrodes 20 is etched by the diluted hydrogen peroxide solution. The silicon nitride films forming the fifth insulating film 18 and the third insulating film 14 as well as the silicon oxide film forming the second insulating film 12 are also etched by the diluted hydrogen peroxide solution, but the etch rate is extremely small, resulting in a sufficient selectivity ratio for titanium nitride. For this reason, the etching amount by which the fifth insulating film 18, the third insulating film 14, and the second insulating film 12 are etched is small enough to ignore.

Figure 5A:
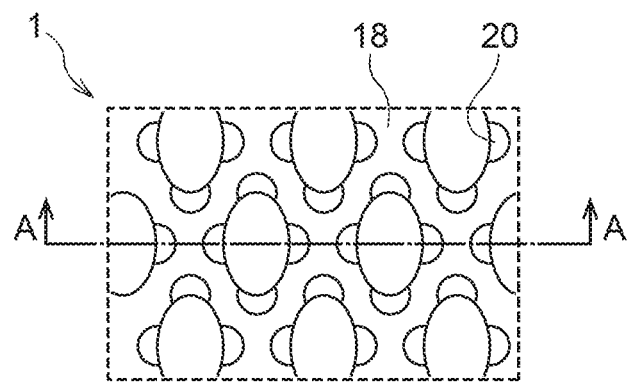
FIGS. 5A and 5B are a diagrammatic top view and a diagrammatic cross-sectional side view, respectively, of the example assembly of FIGS. 5A and 5B at an example process stage following that of FIGS. 4A and 4B. The view of FIG. 5B is along the line A-A of FIG. 5A.
Figure 5B:
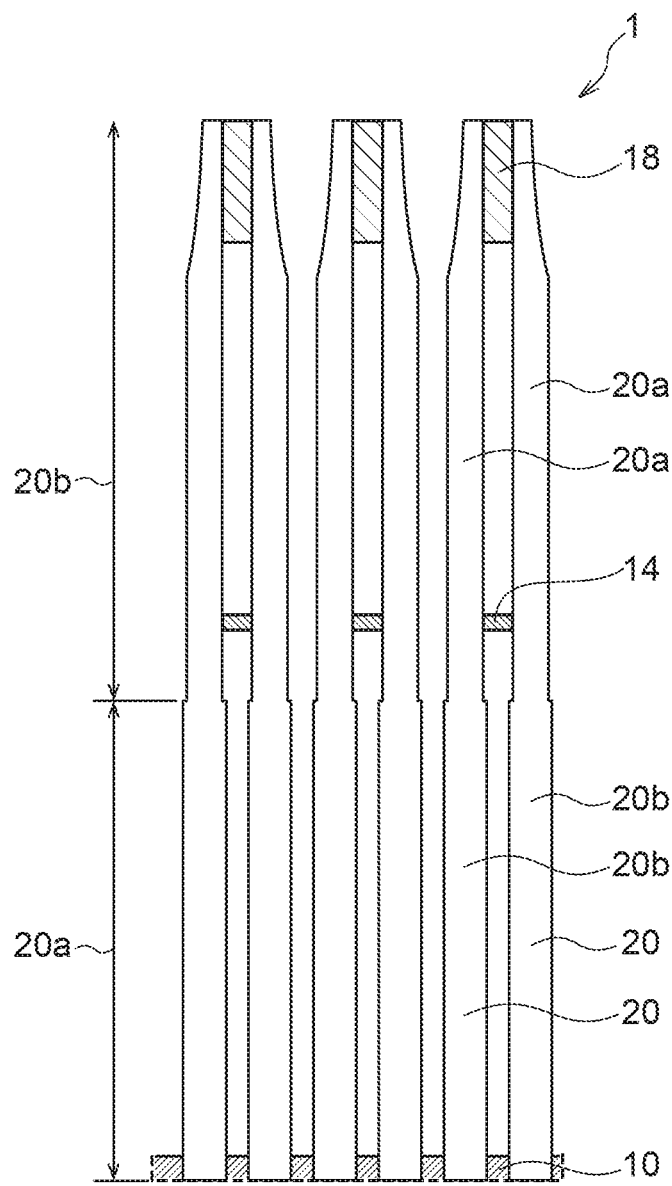

Next, as illustrated in FIGS. 5A and 5B, the second insulating film 12 is removed by etching using BHF, for example. With this etching, a structure is obtained in which a plurality of pillar-shaped lower electrodes 20 extend vertically and are mechanically supported by the third insulating film 14 and the fifth insulating film 18. The third insulating film 14 and the fifth insulating film 18 support and secure the positions of the lower electrodes 20 so that the lower electrodes 20 erected and extending thinly in the vertical direction are not broken, and so that adjacent lower electrodes 20 do not contact each other.

As illustrated in FIG. 5B, each of the lower electrodes 20 can be subdivided into an upper portion 20a whose diameter has been decreased due to the etching using the diluted hydrogen peroxide solution, and a lower portion 20b unaffected by the etching using the diluted hydrogen peroxide solution.

Figure 6A:
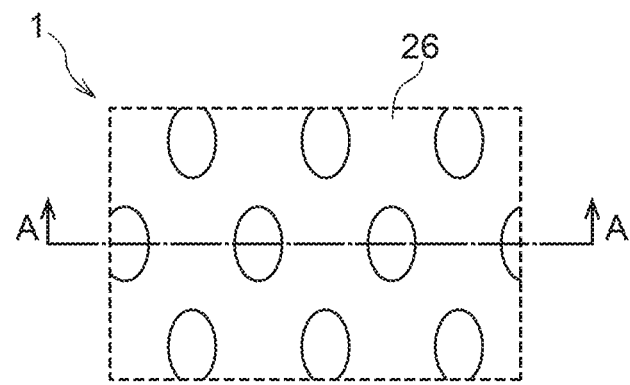
FIGS. 6A and 6B are a diagrammatic top view and a diagrammatic cross-sectional side view, respectively, of the example assembly of FIGS. 6A and 6B at an example process stage following that of FIGS. 5A and 5B. The view of FIG. 6B is along the line A-A of FIG. 6A.
Figure 6B:
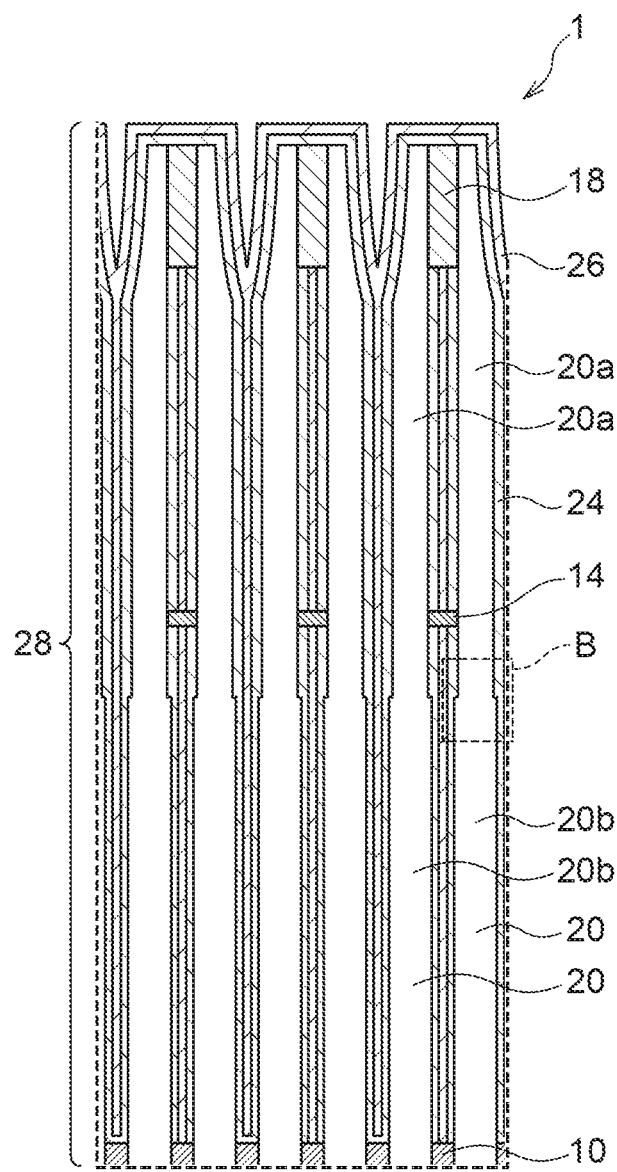

Next, as illustrated in FIGS. 6A and 6B, a capacitive insulating film 24 and the upper electrode 26 are sequentially formed on the surface of the lower electrodes 20. The capacitive insulating film 24 is an insulating film. The capacitive insulating film 24 is a high-k film having a high dielectric constant, and contains an oxide material such as $HfO_2$, $ZrO_2$, $Al_2O_3$, or $ZrO_2$, for example. The capacitive insulating film 24 is formed by CVD, for example. The upper electrode 26 contains a conductive material. For example, the upper electrode 26 contains titanium nitride. The upper electrode 26 is formed by CVD, for example. By the above step, the capacitor 28 is formed having a structure in which the capacitive insulating film 24 is sandwiched by the lower electrodes 20 and the upper electrode 26.

Through the above steps, the semiconductor device 1 according to the embodiment can be obtained.

Figure 7:
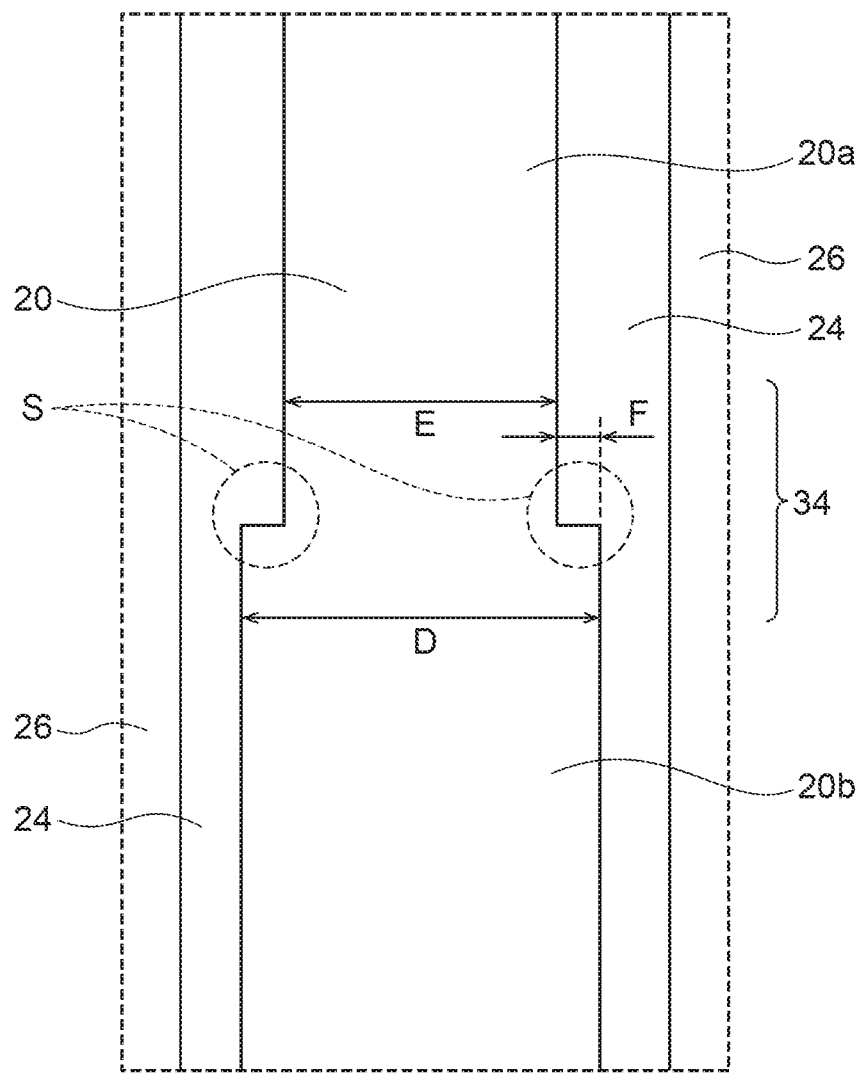
FIG. 7 is an enlarged view of a portion C of FIG. 6B.

FIG. 7 is an enlarged view of the portion B of FIG. 6B, and is a diagram illustrating the structure of one of the lower electrodes 20 at a boundary 34 between the upper portion 20a and the lower portion 20b. The sign F denotes the etching amount that is etched by the step illustrated in FIGS. 4A and 4B. The sign E denotes the diameter of the upper portion 20a at the boundary 34, while the sign D denotes the diameter of the lower portion 20b. Because the upper portion 20a has been etched by the diluted hydrogen peroxide solution, the diameter of the upper portion 20a is decreased by "2 F" compared to the diameter of the lower portion 20b. At the boundary 34, the diameter E of the upper portion 20a is smaller than the diameter D of the lower portion 20b. Also, at the boundary 34, because a difference between the diameters of the upper portion 20a and the lower portion 20b exists, a step S is formed.

Because the diameter of the lower electrodes 20 increases at lower positions, the distance between adjacent lower electrodes 20 becomes smaller as the diameter of the lower electrodes 20 increases. The distance between adjacent lower electrodes 20 can be controlled by an etching amount F etched by the diluted hydrogen peroxide solution. The etching amount F is set so that at the top edges of the lower electrodes 20, a region allowing the formation of the capacitive insulating film 24 and the upper electrode 26 between adjacent lower electrodes 20 without blockage can be secured.

According to the semiconductor device 1 and the method for manufacturing the same according to the embodiment, by etching the upper portion 20a of increased diameter to reduce the diameter of the upper portion 20a, a suitable distance between adjacent lower electrodes 20 can be secured at the top edges of the lower electrodes 20, and a region allowing the formation of the capacitive insulating film 24 and the upper electrode 26 without blockage can be secured. Furthermore, it is possible to secure the capacitance of the capacitor 28 to be formed by not reducing the diameter of the lower portion 20b where reducing the diameter is not necessary. Also, because it is not necessary to reduce the top diameter of the lower electrodes, it is possible to avoid a situation in which the bottom diameter becomes smaller and an opening is not formed in the floor of the lower electrodes. Consequently, according to the above configuration, the yield of the semiconductor device 1 can be improved.

As above, the semiconductor device 1 according to the embodiment is described by citing DRAM as an example, but is not limited thereto. The semiconductor device 1 according to the embodiment is also applicable to a logic IC such as a microprocessor or an application-specific integrated circuit (ASIC) installed onboard DRAM.

Also, in the embodiment, if the lower electrodes 20 are sufficiently reinforced by the existence of the fifth insulating film 18, it is also possible to remove the third insulating film 14. In this case, it is possible to form the second insulating film 12 and the fourth insulating film 16 as a single insulating film.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method of manufacturing a semiconductor device comprising:
    forming an insulating film;
    forming a hole in the insulating film;
    forming a lower electrode of a capacitor, the lower electrode having an upper portion and a lower portion by filling a conductive material in the hole;
    forming an opening in the insulating film by removing a part of the insulating film to expose the upper portion of the lower electrode; and
    reducing the diameter of the upper portion of the lower electrode.

2. The method of claim 1, wherein the lower electrode has a pillar shape extending vertically.

3. The method of claim 1, wherein the conductive material comprises titanium nitride.

4. The method of claim 1, wherein a diameter of the upper portion is smaller than a diameter of the lower portion at a boundary between the upper portion and the lower portion.

5. The method of claim 1, wherein a step is provided at a boundary between the upper portion and the lower portion.

6. The method of claim 1, further comprising:
    forming a capacitive insulating film and forming an upper electrode.

7. The method of claim 6, wherein the lower electrode, the capacitive insulating film, and the upper electrode form a capacitor.

8. A method of manufacturing a semiconductor device comprising:
- forming a first insulating film;
- forming a second insulating film;
- forming a third insulating film having an opening;
- forming a fourth insulating film;
- forming a fifth insulating film;
- forming a plurality of holes reaching from the surface of the fifth insulating film to a bottom surface of the first insulating film;
- forming a lower electrode of a capacitor having an upper portion and a lower portion by filling a conductor in the hole;
- forming an opening between the adjacent holes between the fifth insulating film and the fourth insulating film;
- exposing an upper portion of the lower electrode by removing the fourth insulating film and a part of the second insulating film; and
- reducing the diameter of the upper portion of the lower electrode.

9. The method of claim 8, wherein the lower electrode has a pillar shape extending vertically.

10. The method of claim 8, wherein the lower electrode comprises titanium nitride.

11. The method of claim 8, wherein the first insulating film, the third insulating film, and the fifth insulating film comprise silicon nitride films.

12. The method of claim 8, wherein the second insulating film and the fourth insulating film comprise silicon oxide films.

13. The method of claim 8, further comprising:
- removing the second insulating film;
- forming a capacitive insulating film; and
- forming an upper electrode.

14. The method of claim 8, wherein reducing the diameter of the upper portion of the lower electrode provides a step at the boundary between the upper portion and the lower portion.

15. The method of claim 1, wherein removing the part of the insulating film forms a beam between the lower electrode and an adjacent lower electrode.

16. The method of claim 1, wherein the forming the opening in the insulating film by removing the part of the insulating film includes exposing a portion of another insulating film below the insulating film and adjacent to the upper portion of the lower electrode.

* * * * *